(12) United States Patent
Jian

(10) Patent No.: US 8,018,724 B2
(45) Date of Patent: Sep. 13, 2011

(54) SERVER CABINET AND COMPUTER SERVER SYSTEM USING SAME

(75) Inventor: Zh-Wei Jian, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 171 days.

(21) Appl. No.: 12/617,635

(22) Filed: Nov. 12, 2009

(65) Prior Publication Data

US 2011/0096485 A1    Apr. 28, 2011

(30) Foreign Application Priority Data

Oct. 26, 2009   (CN) .......................... 2009 1 0308770

(51) Int. Cl.
*H05K 5/00*   (2006.01)
*H05K 7/16*   (2006.01)
(52) U.S. Cl. ....................................... 361/724; 361/726
(58) Field of Classification Search ............. 361/679.31, 361/679.32, 724–733; 439/39, 121, 122
See application file for complete search history.

(56) References Cited

U.S. PATENT DOCUMENTS

| | | | |
|---|---|---|---|
| 6,229,708 B1 * | 5/2001 | Corbin et al. ................. 361/728 |
| 6,385,053 B1 * | 5/2002 | Parizi et al. ................... 361/786 |
| 6,544,057 B1 * | 4/2003 | Stremick et al. .............. 439/162 |
| 6,563,701 B1 * | 5/2003 | Peng et al. ................ 361/679.34 |
| 7,180,753 B2 * | 2/2007 | Kerrigan et al. ............... 361/797 |
| 7,408,775 B2 * | 8/2008 | Walz et al. .................... 361/699 |
| 7,525,815 B2 * | 4/2009 | Chen et al. .................... 361/788 |
| 7,663,889 B2 * | 2/2010 | Lajara et al. .................. 361/759 |
| 2003/0146176 A1 * | 8/2003 | Danello et al. .................. 211/26 |
| 2004/0264123 A1 * | 12/2004 | Kerrigan et al. .............. 361/686 |
| 2007/0072443 A1 * | 3/2007 | Rohrbach et al. ............... 439/39 |
| 2007/0115627 A1 * | 5/2007 | Carlisi et al. .................... 361/686 |
| 2007/0217172 A1 * | 9/2007 | Bisbikis et al. ............... 361/753 |
| 2008/0002355 A1 * | 1/2008 | Carnevali ...................... 361/686 |
| 2008/0037218 A1 * | 2/2008 | Sharma et al. ................. 361/695 |
| 2008/0144293 A1 * | 6/2008 | Aksamit et al. ................ 361/727 |
| 2008/0253076 A1 * | 10/2008 | Chen .............................. 361/684 |
| 2009/0073666 A1 * | 3/2009 | Tsai et al. ...................... 361/740 |
| 2009/0097200 A1 * | 4/2009 | Sharma et al. ................. 361/688 |

* cited by examiner

*Primary Examiner* — Jinhee Lee
*Assistant Examiner* — Adrian S Wilson
(74) *Attorney, Agent, or Firm* — Altis Law Group, Inc.

(57) ABSTRACT

A server cabinet includes a rack and a plurality of I/O modules received in the rack. The rack defines an interior space for accommodating a plurality of servers therein. Each server includes a plurality of I/O ports at an outer side thereof. Each of the I/O modules includes a casing, a driving mechanism received in the casing and a plurality of I/O sockets. A plurality of apertures corresponding to the I/O sockets are defined in one side of the casing. The driving mechanism is configured for controlling the I/O sockets telescopically move out of the casing through the apertures or back to the casing. The I/O sockets of each of the I/O modules is configured to electrically connect the I/O ports of each of the servers, respectively, when the I/O sockets are out of the casing.

16 Claims, 6 Drawing Sheets

SERVER CABINET AND COMPUTER SERVER SYSTEM USING SAME

BACKGROUND

1. Technical Field

The present disclosure relates to computer servers, and more particularly to a server cabinet providing a plurality of I/O modules for servers accommodated therein and a computer server system using the same.

2. Description of Related Art

Computer server systems often include multiple standard servers mounted in a standard server cabinet. Each server is a stand-alone computer that includes many electric components, such as one or more processors, RAM, fixed disks, AC to DC power supplies, and the like.

The servers are usually arranged in the server cabinet one-by-one from bottom-to-top. Each server has a standard rectangular profile, and includes a plurality of I/O ports for electrically connecting the server to a plurality of I/O equipments out of the server cabinet via a plurality of electrical wires, respectively. Accordingly, when multiple servers are installed in the server cabinet, a lot of electrical wires are required to extend through the server cabinet to interconnect the servers and the I/O equipments, which results in a complicated and inefficient arrangement. The electrical wire also occupy significant space in the rear of the server cabinet, disturbing outflow of air, thereby limiting system cooling and endangering the system.

It is thus desirable to provide a server cabinet which can overcome the described limitations.

DETAILED DESCRIPTION

Figure 1:
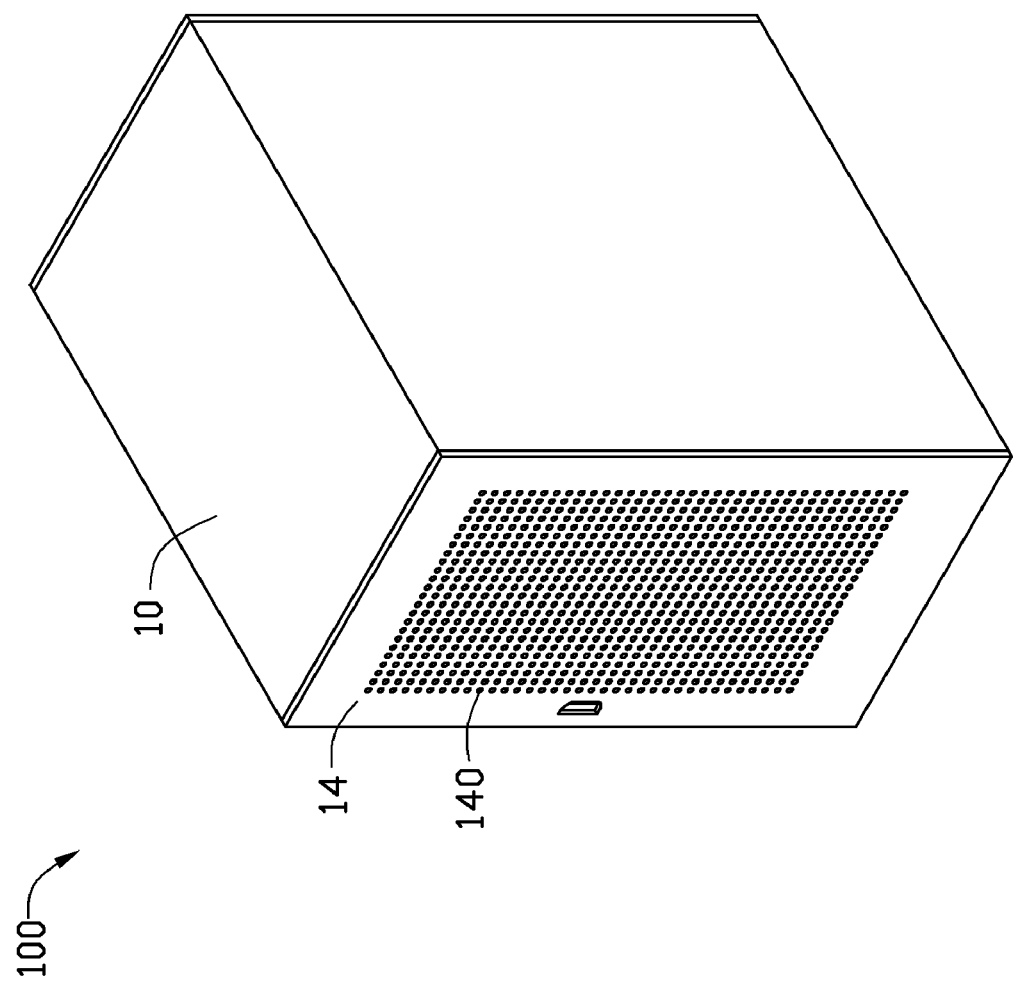
FIG. 1 is an isometric, assembled view of a computer server system in accordance with an exemplary embodiment of the present disclosure.

Reference will now be made to the drawing figures to describe the present server cabinet in detail.

Figure 2:
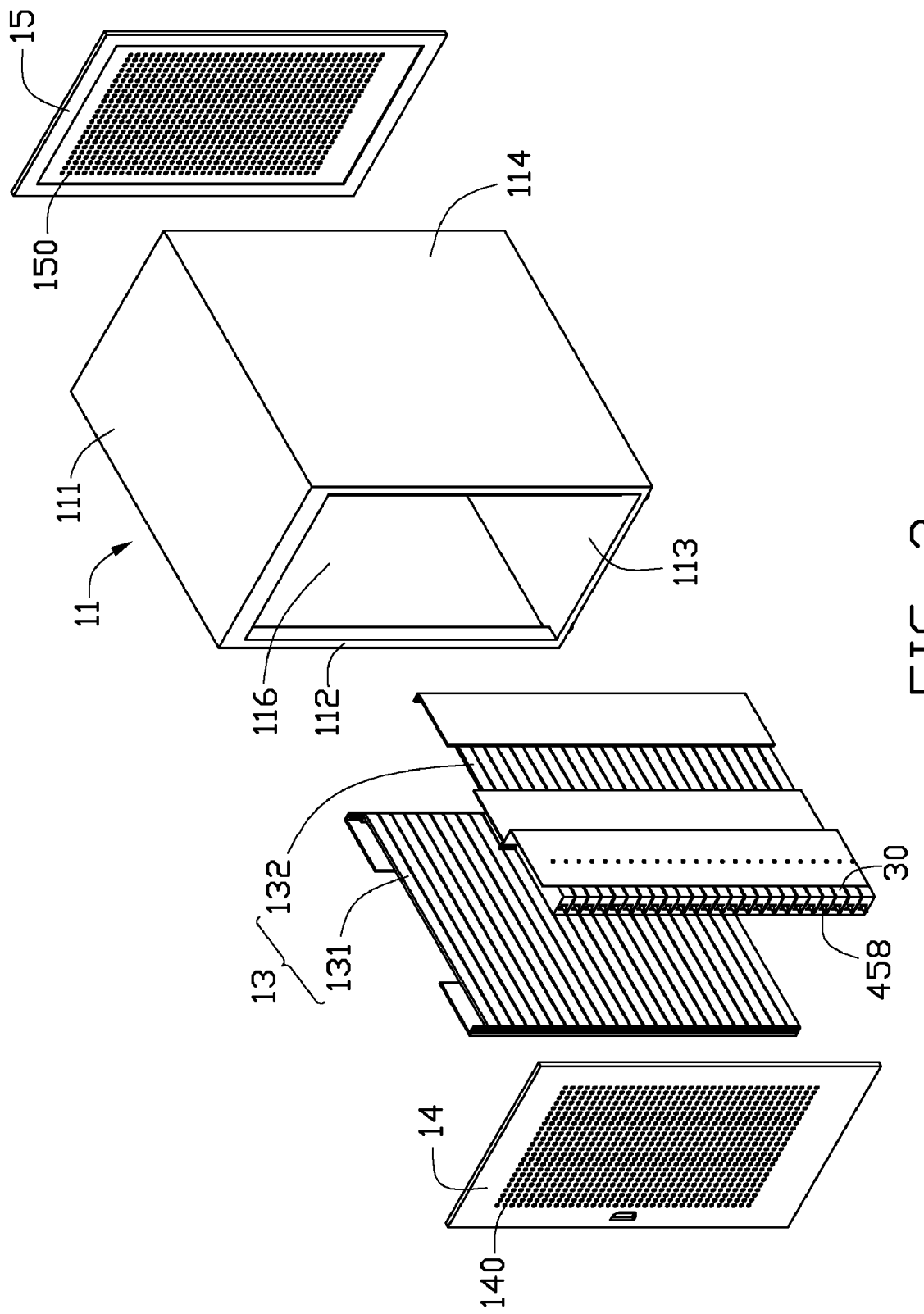
FIG. 2 is an isometric, exploded view of a server cabinet of the computer server system of FIG. 1.
Figure 6:
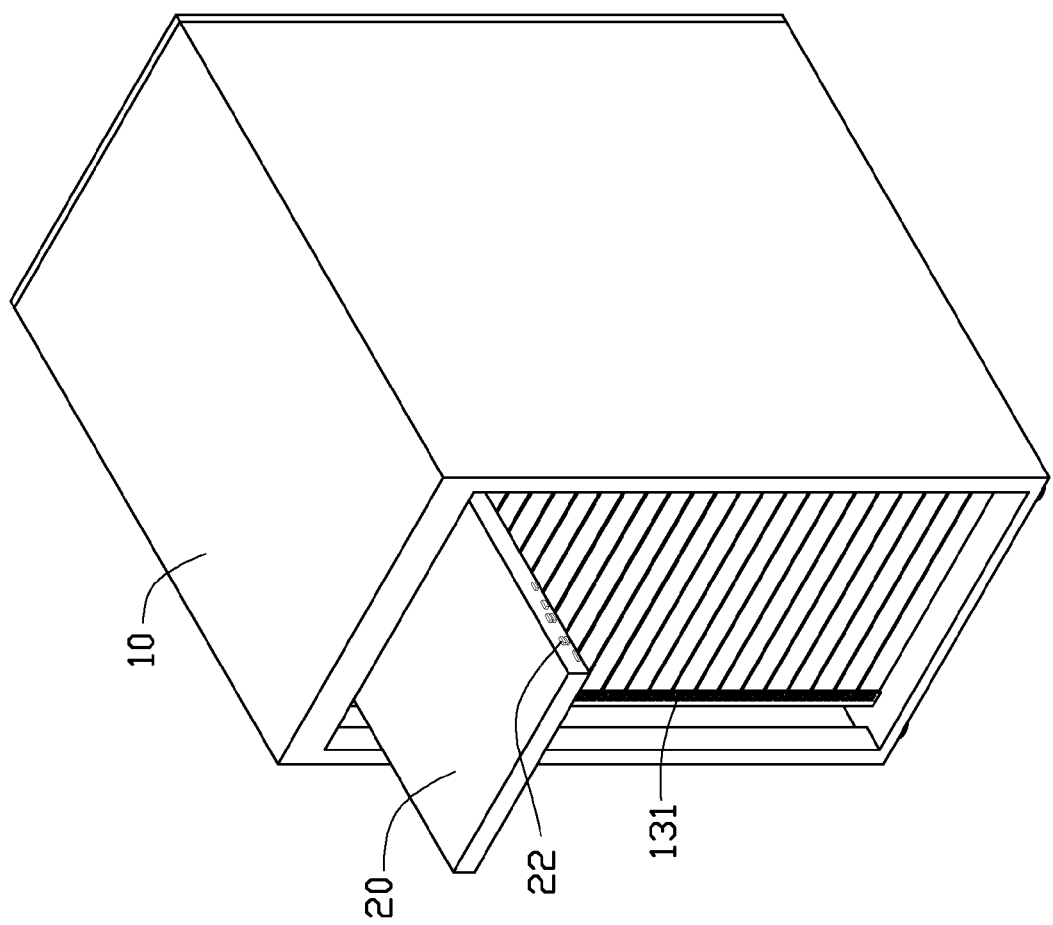
FIG. 6 is a schematic view of a server being inserted into the server cabinet, from which a front door has been omitted.

Referring to FIG. 1, a computer server system 100 according to an exemplary embodiment of the present disclosure is shown. Referring also to FIGS. 2 and 6, the computer server system 100 includes a server cabinet 10 and a plurality of servers 20 accommodated in the server cabinet 10. Each server 20 has a standard rectangular profile. The server cabinet 10 can receive, in this embodiment, at most twenty-four servers 20 therein. Each server 20 includes a plurality of I/O ports 22 at a front portion of a right side thereof.

The server cabinet 10 includes a rack 11, a plurality of pairs of rails 13 and a plurality of I/O modules 30 received in the rack 11, a front door 14 and a back plate 15 respectively at two opposite sides of the rack 11. The rack 11 includes a rectangular top wall 111, a bottom wall 113 parallel to the top wall 111, a left sidewall 112 and a right sidewall 114 respectively connected between two corresponding opposite sides, i.e., left and right sides, of the top and the bottom walls 111, 113. The front door 14 and the back plate 15 are connected between another two corresponding opposite sides, i.e., front and rear sides, of the top and the bottom walls 111, 113. The top wall 111, the bottom wall 113, the left and the right sidewalls 112, 114 cooperatively define a rectangular receiving space 116 for receiving the servers 20 therein. Each of the front door 14 and the back plate 15 defines a plurality of air ventilation holes 140, 150 therein. The front door 14 and the back plate 15 are pivotally attached to the front and the back of the rack 11, respectively, so that the front door 14 and the back plate 15 can be opened and closed relative to the rack 11 according to need.

Each pair of rails 13 includes a first rail 131 extended front-to-back at the left side of the rack 11 and a second rail 132 extended front-to-back at the right side of the rack 11. The pairs of rails 13 are spaced equally from each other bottom-to-top. The first rail 131 and the second rail 132 of each pair of rails 13 are on the same level. The first rail 131 has a length along an extending direction thereof larger than the second rail 132. When the pairs of the rails 13 are installed in the rack 11, the first rail 131 extends from near the front door 14 of the server cabinet 10 to near the back plate 15 of the server cabinet 10, a rear end of the second rail 132 is aligned with a rear end of the first rail 131, and a front end of the second rail 132 is spaced a distance from the front door 14. Each pair of rails 13 supports a server 20 thereon. The I/O modules 30 are arranged bottom-to-top and located between the front ends of the second rails 132 and the front door 14.

Figure 3:
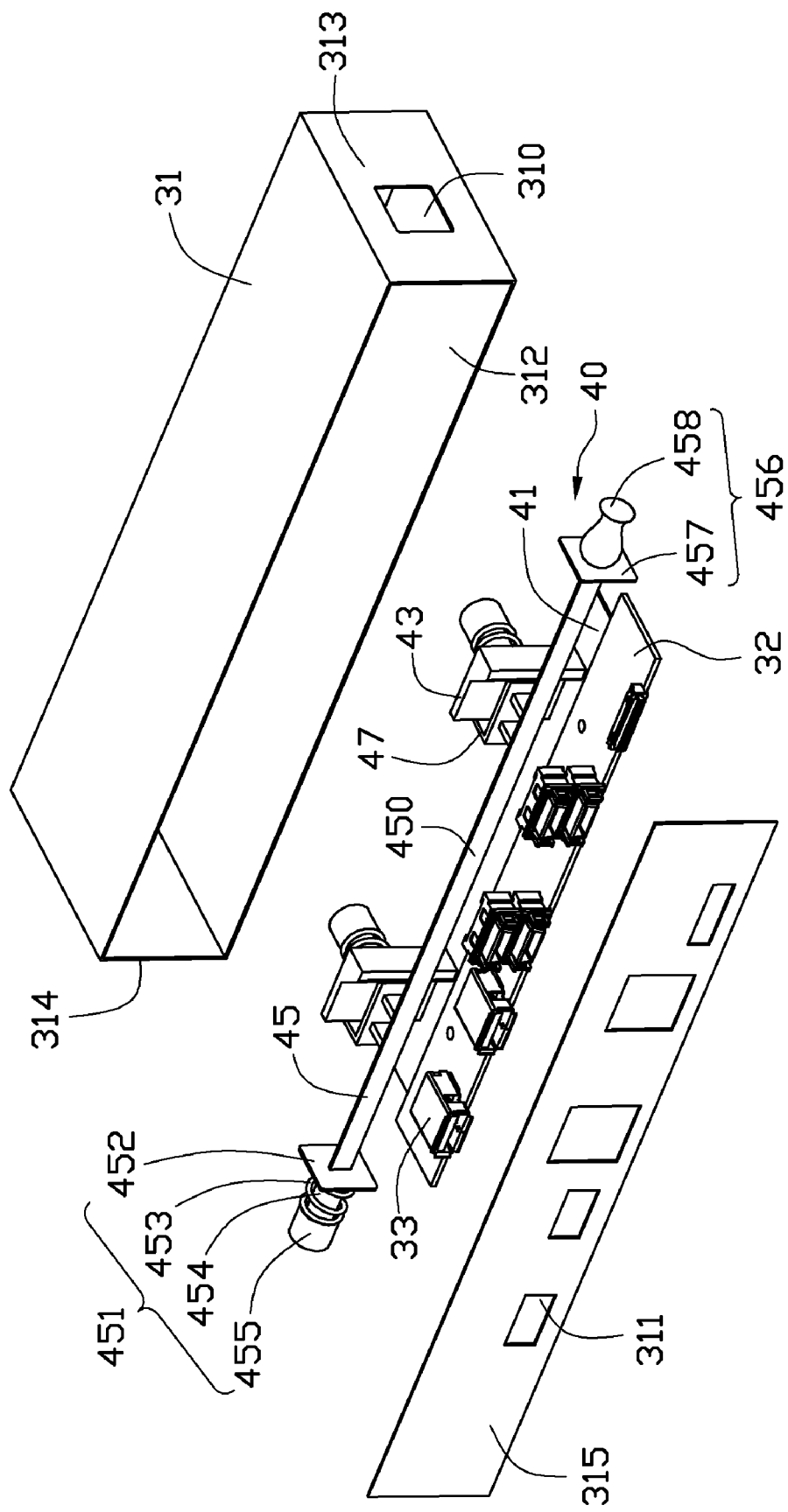
FIG. 3 is an isometric, exploded view of an I/O module of the server cabinet of FIG. 2.

Referring to FIG. 3, each of the I/O modules 30 includes an elongated, hollow casing 31, a print circuit board 32 received in an interior the casing 31, a plurality of I/O sockets 33 mounted on a top surface of the print circuit board 32, and a driving mechanism 40 received in the casing 31 for controlling the I/O sockets 33 to protrude out of the casing 31 or be received in the interior of the casing 31 according to need.

The casing 31 has a rectangular profile, and defines an opening 310 in a right side 313 thereof. A plurality of apertures 311 corresponding to the I/O sockets 33 are defined in a front side 315 of the casing 31. The print circuit board 32 is located on a top surface of a bottom board 312 of the casing 31 and adjacent to the front side 315 of the casing 31. The I/O sockets 33 extend beyond an edge, which is adjacent to the front side 315 of the casing 31, of the print circuit board 32.

Figure 4:
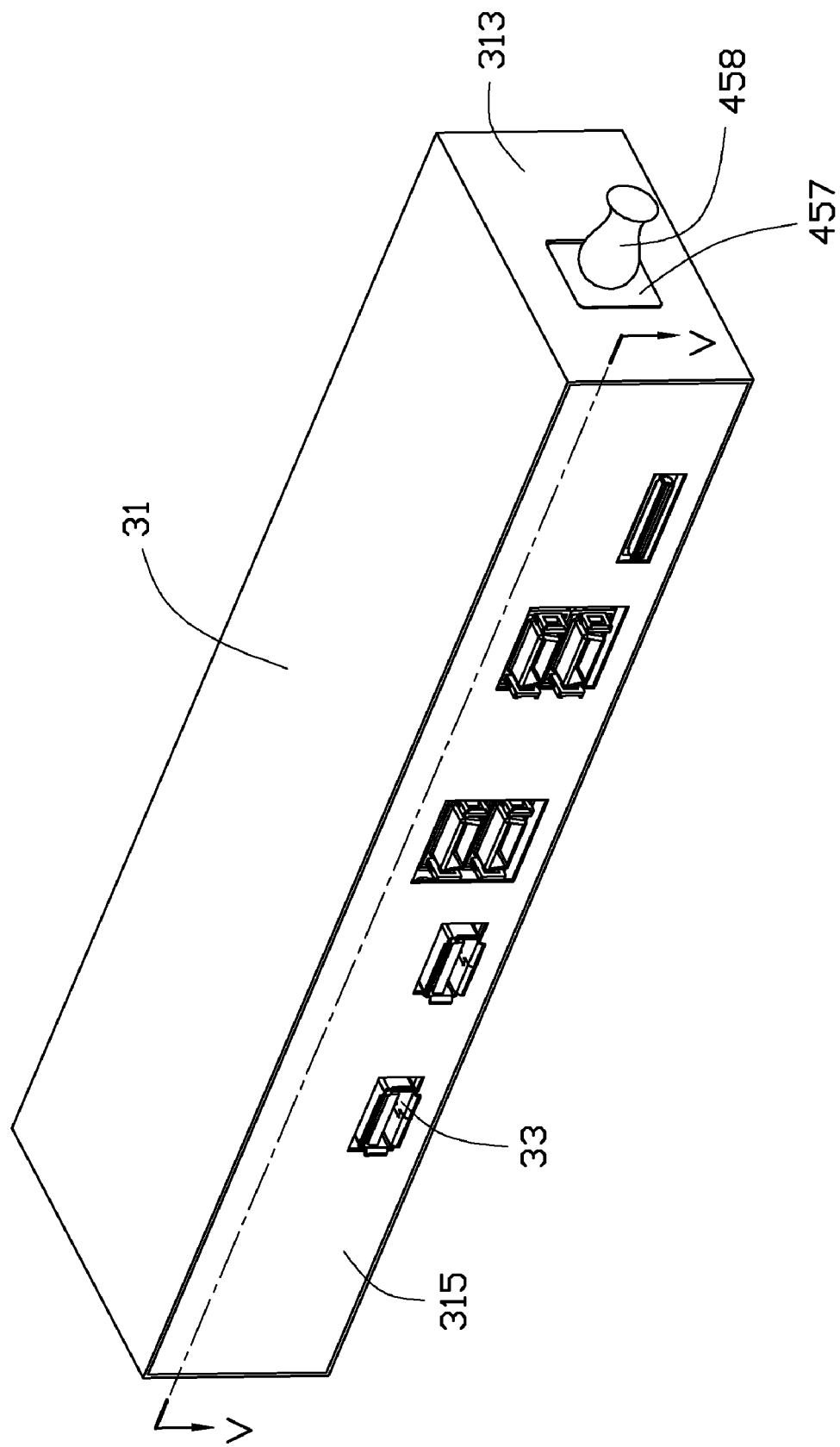
FIG. 4 is an assembled view of the I/O module of FIG. 3.
Figure 5:
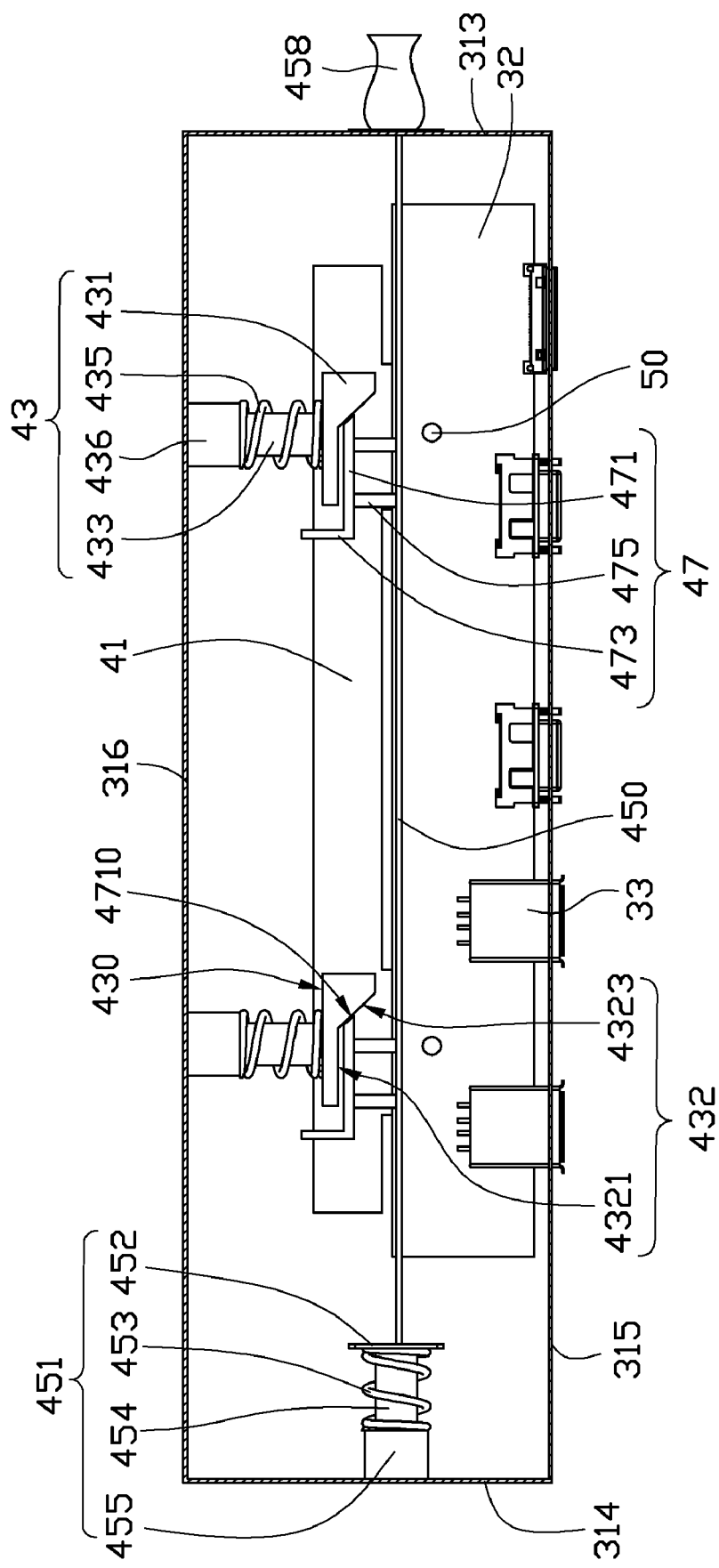
FIG. 5 is a top, cross-section view of the I/O module of FIG. 4, taken along line V-V thereof.

The driving mechanism 40 includes an elongated supporting plate 41, two guiding portions 43 extending upwardly and perpendicularly from left and right ends of the supporting plate 41, respectively, an elongated pull rod 45 located above the supporting plate 41 and two sliding portions 47 extending horizontally and perpendicularly from left and right ends of the pull rod 45, respectively. Referring also to FIGS. 4 and 5, each of the guiding portions 43 includes a guiding block 431 extending upwardly from a top surface of the supporting plate 41, a first connecting post 433 extending perpendicularly from the guiding block 431, and a first spring 435 and a first fixing element 436 mounted around the first connecting post 433. The first fixing element 436 is annular, columned shaped, and has one end fixedly connected to a rear side 316 of the casing 31. The guiding block 431 includes a planar first surface 430 facing the rear side 316 of the casing 31 and a stepped second surface 432 facing the front side 315 of the casing 31. The first connecting post 433 extends perpendicularly from the first surface 430 of the guiding block 431 towards the rear side 316 of the casing 31. The second surface 432 includes an abutment surface 4321 parallel to the first surface 430 and a guiding surface 4323 extending slantwise from a right end of the abutment surface 4321 towards the front side 135 of the casing 31. The abutment surface 4321 and the guiding surface 4323 form an obtuse angle therebetween. The guiding surface 4323 has an inner end adjacent to the abutment surface 4321 and an opposite outer end far away from the abutment surface 4321. A distance between the first surface 430 and the second surface 432 maintains constant between the abutment surface 4321 and the first surface 430, and gradually increases from the inner end of the guiding surface 4323 to the outer end of the guiding surface 4323.

The first connecting post 433 is loosely received in the first fixing element 436. The first spring 435 is mounted around the first connecting post 433 and connected between the guiding block 431 and the first fixing element 436. Two opposite ends of the first spring 435 abut against the first surface 430 of the guiding block 431 and the first fixing element 436, respectively. The first connecting post 433 can telescopically move front-to-back along an axial direction of the first fixing element 436, to thereby force the first spring 435 to be stretched out or compressed along with the telescopic movement of the first connecting post 433.

The pull rod 45 includes an elongated shaft 450, a fixing portion 451 and a force application portion 456 formed at left and right ends of the shaft 450, respectively. The force application portion 456 includes a rectangular dustproof plate 457 extending perpendicularly and radially from an outer surface of the right end of the shaft 430 and a handle 458 extending linearly and outwardly from the right end of the shaft 430. The fixing portion 451 includes a pressing plate 452 extending perpendicularly and radially from an outer surface of the left end of the shaft 430, a second connecting post 454 extending linearly and outwardly from the left end of the shaft 430, and a second spring 453 and a second fixing element 455 mounted around the second connecting post 454.

The second connecting post 454, the second spring 453 and the second fixing element 455 respectively have a shape the same as the first connecting post 433, the first spring 435 and the first fixing element 436. One end of the second fixing element 455 is fixedly connected to a left side 314 of the casing 31. A distance between the second fixing element 455 and the bottom surface 316 of the casing 31 substantially equals to a distance between each of the first fixing elements 436 and the bottom surface 316 of the casing 31. The second connecting post 454 is loosely received in the second fixing element 455 with the second spring 453 connected between the second fixing element 455 and the pressing plate 452, to thereby connect the pull rod 45 with the left side 314 of the casing 31. Similarly, the second connecting post 454 can telescopically move leftwards or rightwards along an axial direction of the second fixing element 455, to thereby force the second spring 453 to be stretched out or compressed along with the telescopic movement of the second connecting post 454. The handle 458 extends horizontally through the opening 310 of the right side 313 of the casing 31 and protrudes out of the casing 31. The dustproof plate 457 is located in the opening 310 to thereby prevent dust or other particles from entering the casing 31.

Each of the sliding portions 47 includes a sliding wall 471 parallel to the shaft 450, a preventing wall 473 extending perpendicularly from a left end of the sliding wall 471, and two connecting walls 475 connected between the sliding wall 471 and the shaft 450. An inclined surface 4710 is formed at a right end of the sliding wall 471. The sliding wall 471 is parallel to the abutment surface 4321 of the guiding block 431. A slope of the inclined surface 4710 of the sliding wall 471 equals to that of the guiding surface 4323 of the guiding block 431. The inclined surface 4710 of the sliding wall 471 abuts against the guiding surface 4323 of the guiding block 431. The preventing wall 473 extends across a left end of the abutment surface 4321 of the guiding block 431 towards the rear side 316 of the casing 31. A length of the preventing wall 473 along front-to-back is slightly longer than a maximal length of the guiding block 431 at the outer end of the guiding surface 4323, thus to limit a range of a relative movement between the sliding plate 471 and the guiding block 431.

The print circuit board 32 is located on the supporting plate 41 of the driving mechanism 40, a plurality of securing elements, such as bolts 50, extended through the print circuit board 32 and inserted into the supporting plate 41 to fixedly connect the print circuit board 30 and the supporting plate 41 together. When the first and the second springs 435, 453 are raised in natural state, the sliding walls 471 contact the abutment surfaces 4321 of the guiding blocks 431, respectively, with the inclined surfaces 4710 abutting against the inner ends of the guiding surfaces 4323. At this moment, the print circuit board 32 is located adjacent to the front side 315 of the casing 31, and the I/O sockets 33 are extended through the apertures 311 of the front side 315 of the casing 31 to protrude out of casing 31. When a force is applied on the handle 458 to pull the pull rod 45 outwardly, the second spring 453 is stretched out, thereby forcing the sliding walls 471 to move with respect to the guiding blocks 431 via the inclined surfaces 4710 sliding along the guiding surfaces 4323 from the inner ends towards the outer ends. Simultaneously, the sliding walls 471 push the guiding blocks 431 to move rearwards towards the rear side 316 of the casing 31, the first springs 435 are compressed, and the print circuit board 32 and the supporting plate 41 move together with the guiding blocks 431 towards the rear side 316 of the casing 31. Understandably, the I/O sockets 33 move towards the rear side 316 of the casing 31 in the same way as the print circuit board 32. When the inclined surfaces 4710 of the sliding walls 471 are reached the outer ends of the guiding surfaces 4323, the print circuit board 32 is spaced a distance from the front side 315 of the casing 31, and the I/O sockets 33 are received in the interior of the casing 31.

When the pull rod 45 is released, the first and the second spring 435, 453 are gradually restored to natural state. Thus the sliding walls 471 are moved with respect to the guiding blocks 431 via the inclined surfaces 4710 sliding from the outer ends of the guiding surfaces 4323 back towards the inner ends, and the guiding blocks 431 move frontwards towards the front side 315 of the casing 31 accordingly. Therefore, the print circuit board 32 with the I/O sockets 33 provided thereon also moves frontwards towards the front side 315 of the casing 31. When the first and the second spring 435, 453 are raised in the natural state again, the print circuit board 32 is located adjacent to the front side 315 of the casing 31, and the I/O sockets 33 protrude out of the casing 31 via the apertures 311.

When assembled, the I/O modules 30 are firstly arranged bottom-to-top on the front portion of the rack 11. The rear side 316 of each of the I/O modules 30 abuts the right sidewall 114. The front side 315 of each of the I/O modules 30 faces the left sidewall 112. The right side 313 faces the front side of the rack 11. The handles 458 of the I/O modules 30 are protruded in the front side of the rack 11. Then the servers 20 are stacked bottom-to-top on the rack 11 with the I/O ports 22 electrically connected with the I/O sockets 33 of the I/O modules 30, respectively. Referring also to FIG. 6, when being installed in the server cabinet 10, a server 20 is positioned at the front end of the server cabinet 10 aligned with a corresponding pair of rails 13, the handle 458 of the I/O module 30 which is located at a same level with the pair of rails 13 is pulled outwardly to make the I/O sockets 33 being received in the casing 31, then the server 20 is slid horizontally from the front end of the server cabinet 10 towards the rear end of the server cabinet 10 along the corresponding pair of rails 13 until the server 20 is entirely received in the server cabinet 10. At this time, release the handle 458 of the I/O module 30, and the I/O sockets 33 of the I/O module 30 are protruded out of the casing 31 to insert into the I/O ports 22 of the server 20. Furthermore, the I/O module 30 is electrically connected to I/O equipments which are located at an outside of the server cabinet 10 to thereby connect the server 20 to the I/O equipments. During operation, air outside the front side of the server cabinet 10 flows into the server cabinet 10 via the air ventilation holes 140 of the front door 14, then flows front-to-back to exchange heat with the servers 20 and finally flows out of the server cabinet 10 via the air ventilation holes 150 of the back plate 15.

Due to the presence of the I/O modules 30, each installed server 20 can electrically connected to the I/O equipments which are located at the outside of the server cabinet 10 without a lot of electric wires connected between the back of the servers 20 and the server cabinet 10 increasing empty space between the back of the servers 20 and the back plate 15. Thus, the hot air in the server cabinet 10 can flow out of the server cabinet 10 from the back plate 15 more smoothly, increasing heat dissipation efficiency of the server system 100. On another aspect, the I/O sockets 33 of each of the I/O modules 30 can move telescopically to protrude out of the casing 31 or be received in the casing 31 by manipulating the handle 458 conveniently, each server 20 can be preferably electrically connected to the I/O sockets 33 when the I/O sockets 33 are protruded out of the casing 31, such that connection of the server 20 to the I/O module 30 is considerably simplified. Furthermore, the I/O modules 30 are provided in the front portion of the rack 11, it is convenient for operator at the front side to connect the I/O modules 30 to the I/O equipments, thus to avoid uncomfortable of the operator caused by the hot air from the back plate 15 of the server cabinet 10.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server cabinet comprising:
a rack defining an interior space configured for accommodating a plurality of servers therein, each server comprising a plurality of I/O ports at an outer side thereof; and
a plurality of I/O modules received in the rack, each of the I/O modules comprising a casing, a driving mechanism received in the casing and a plurality of I/O sockets, a plurality of apertures corresponding to the I/O sockets being defined in one side of the casing, the driving mechanism configured for controlling the I/O sockets to telescopically move out of the casing through the apertures or back to the casing, the I/O sockets of each of the I/O modules configured to electrically connect the I/O ports of each of the servers, respectively, when the I/O sockets are out of the casing.

2. The server cabinet of claim 1, wherein each of the I/O modules comprises a print circuit board received in the casing, the I/O sockets mounted on the print circuit board and extended beyond an edge of the print circuit board.

3. The server cabinet of claim 2, wherein the driving mechanism of each of the I/O modules comprises a supporting plate, at least one guiding block extending upwardly from the supporting plate and a pull rod; the supporting plate is connected the print circuit board, the pull rod comprises a shaft and at least one sliding plate connected one side of the shaft; the at least one guiding block comprises an inclined guiding surface, the at least one sliding plate has one end against the guiding surface of the at least one guiding block; and the at least one sliding plate can be moved with respect to the at least one guiding block via the end sliding along the guiding surface to drive the print circuit board to telescopically move in the casing, thereby controlling telescopically movement of the I/O sockets.

4. The server cabinet of claim 3, wherein the end of the sliding plate includes an inclined surface contacted the guiding surface, a slope of the inclined surface substantially equal to that of the guiding surface.

5. The server cabinet of claim 3, wherein the driving mechanism comprises a first spring connected between the at least one guiding block and the casing and a second spring connected between one end of the shaft and the casing; when the first and the second springs are in natural state, the end of the at least one sliding plate is against one end of the guiding surface and the I/O sockets protrude out of the casing; when the pull rod is pulled outwardly to force the second spring stretched out, the end of the at least one sliding plate moves from the end of the guiding surface to another end of the guiding surface, the first spring is compressed and the I/O sockets are received in the casing.

6. The server cabinet of claim 5, wherein a handle is formed at another end of the shaft, and the casing defines an opening at another side for the handle extended therethrough.

7. The server cabinet of claim 5, wherein the pull rod comprises a connecting post extending outwardly from the end of the shaft, a pressing plate extending radially from an outer surface of the end of the shaft and an annular fixing element around the connecting post; one end of the fixing element is connected the casing; the second spring is mounted around the connecting post and connected between the fixing element and the pressing plate.

8. The server cabinet of claim 5, wherein the driving mechanism comprises a connecting post extending outwardly from the at least one guiding block and an annular fixing element mounted around the connecting post; one end of the fixing element is connected the casing; the first spring is mounted around the connecting post and connected between the fixing element and the at least one guiding block.

9. The server cabinet of claim 1, wherein the rack comprises a top wall, an opposite bottom wall and two sidewalls respectively connected between two corresponding opposite sides of the top and the bottom walls, the I/O modules arranged bottom-to-top between the top wall and the bottom wall and fixed on one of the sidewalls.

10. The server cabinet of claim 9, wherein the rack further comprises a front door and a back plate each connected between another two corresponding opposite sides of the top and the bottom walls, respectively, each of the front door and the back plate defining a plurality of air ventilation holes therein, the I/O modules located adjacent to the front door.

11. A computer server system comprising:
a rack comprising a top wall, an opposite bottom wall and two sidewalls connected between two corresponding opposite sides of the top and the bottom walls, respectively, an interior space being defined among the top wall, the opposite bottom wall and the sidewalls;

a plurality of servers received in the interior space of the rack and stacked bottom-to-top, each server comprising a plurality of I/O ports at an outer side facing one of the sidewalls thereof; and a plurality of I/O modules received in the rack and stacked bottom-to-top corresponding to the servers, respectively, each of the I/O modules comprising a plurality of I/O sockets electrically connected the I/O ports of the servers.

12. The computer server system of claim 11, wherein each of the I/O modules comprises a casing, a print circuit board and a driving mechanism received in the casing, the I/O sockets mounted on the print circuit board, a plurality of apertures defined in one side of the casing, the driving mechanism configured for controlling the I/O sockets telescopically move out of the casing through the apertures or back to the casing, the I/O sockets of the I/O modules electrically connected the I/O ports of each of the servers, respectively, when the I/O sockets are out of the casing.

13. The computer server system of claim 12, wherein the driving mechanism comprises a supporting plate, at least one guiding block extending upwardly from the supporting plate and a pull rod; the supporting plate is connected the print circuit board, the pull rod comprises a shaft and at least one sliding plate connected one side of the shaft; the at least one guiding block comprises an inclined guiding surface; the at least one sliding plate has one end against the guiding surface of the at least one guiding block; and the at least one sliding plate can move with respect to the at least one guiding block via the end sliding along the guiding surface to drive the print circuit board telescopically moved in the casing, thereby controlling the I/O sockets telescopically move out of the casing or be received in the casing.

14. The computer server system of claim 13, wherein the driving mechanism comprises a first spring connected between the at least one guiding block and the casing, and a second spring connected between one end of the shaft and the casing; when the first and the second springs are in natural state, the end of the at least one sliding plate is against one end of the guiding surface and the I/O sockets protrude out of the casing; when the pull rod is pulled outwardly to force the second spring stretched out, the end of the at least one sliding plate moves from the end of the guiding surface to another end of the guiding surface, the first spring is compressed and the I/O sockets are received in the casing.

15. The computer server system of claim 14, wherein a handle is formed at another end of the shaft, the casing defining an opening at another side for the handle extended therethrough.

16. The computer server system of claim 11, wherein the rack further comprises a front door and a back plate each connected between another two corresponding opposite sides of the top and the bottom walls, respectively, the I/O modules fixed on one of the sidewalls and located adjacent the front door.

* * * * *